United States Patent [19]
Mannerstråle et al.

[11] Patent Number: 6,091,963
[45] Date of Patent: Jul. 18, 2000

[54] MULTI-FREQUENCY BAND RECEIVER FOR RF SIGNAL

[75] Inventors: Jacob Mannerstråle, Eslöv; Martin Isberg, Lund; Björn Lindquist, Bjärred; Torsten Carlsson, Lund; Hans Hagberg, Lund; Peter Jakobsson, Lund; Lars Künkel, Landskrona; Kjell Gustafsson, Lund, all of Sweden

[73] Assignee: Telefonaktiebolaget LM Ericsson, Stockholm, Sweden

[21] Appl. No.: 09/006,867

[22] Filed: Jan. 14, 1998

[30] Foreign Application Priority Data

Jan. 21, 1997 [SE] Sweden .................... 9700169

[51] Int. Cl.$^7$ ..................................... H04B 1/18
[52] U.S. Cl. .................. 455/550; 455/150.1; 455/179.1; 455/188.1
[58] Field of Search ................... 455/550, 552, 455/179.1, 180.1, 188.1, 150.1, 151.1, 151.2

[56] References Cited

U.S. PATENT DOCUMENTS

| | | | |
|---|---|---|---|
| 4,470,147 | 9/1984 | Goatcher | 375/77 |
| 4,578,819 | 3/1986 | Shimizu | 455/135 |
| 5,280,636 | 1/1994 | Kelley et al. | 455/180.1 |
| 5,504,803 | 4/1996 | Yamada et al. | 455/552 |
| 5,535,432 | 7/1996 | Dent | 455/552 |
| 5,574,997 | 11/1996 | Hong | 455/180.1 |
| 5,630,213 | 5/1997 | Vannatta | 455/188.1 |
| 5,835,853 | 10/1998 | Enoki et al. | 455/180.1 |
| 5,881,372 | 3/1999 | Kruys | 455/188.1 |

FOREIGN PATENT DOCUMENTS

| | | | |
|---|---|---|---|
| 0 678 974 | 10/1995 | European Pat. Off. | H03D 7/16 |
| 0 682 458 | 11/1995 | European Pat. Off. | H04Q 7/32 |
| 0 739 090 | 10/1996 | European Pat. Off. | H03D 7/16 |

*Primary Examiner*—Daniel S. Hunter
*Assistant Examiner*—Thvan T. Nguyen
*Attorney, Agent, or Firm*—Burns, Doane, Swecker & Mathis, L.L.P.

[57] ABSTRACT

The present invention relates to a receiver device comprising a receiver (104) adapted to receive radio signals in two frequency bands (FB1, FB2). The radio signals in one of the frequency bands (FB1) constitute communication signals for a radio system (AMPS, NMT) having a certain channel spacing, whereas the radio signals of the second frequency band (FB2) constitutes communication signals for a second radio system (PCS1900, DCS1800, GSM) having a second certain channel spacing. The receiver (104) comprises two inputs (108, 11) each intended for a radio system having different frequency bands and channel spacing. For radio signals occurring on one input (108), mixing is performed from the RF range directly to the baseband frequency range. For radio signals occurring on the second input (108) the mixing from the radio frequency range to the baseband frequency range is carried out through an intermediate frequency range. Further the receiver (104) comprises an output (112) intended to deliver baseband signals for both radio systems. The output (112) is connected to a baseband unit which is common to the radio systems. In the baseband unit, among other things, lowpass filtering, detection and neighbouring channel suppression are performed on the received radio signal that has been mixed down to the baseband frequency range.

17 Claims, 2 Drawing Sheets

MULTI-FREQUENCY BAND RECEIVER FOR RF SIGNAL

This application claims priority under 35 U.S.C. §§119 and/or 365 to SE 9700169-7 filed in Sweden on Jan. 21, 1997; the entire content of which is hereby incorporated by reference.

TECHNICAL FIELD

The present invention relates to a receiver for receiving signals in different frequency bands. The invention is primarily intended for use as a receiver in a mobile telephone for two different types of networks.

STATE OF THE ART

Establishing a connection between a mobile telephone and a mobile telephone network often fails when the network is heavily loaded, since the mobile telephony network has a certain maximum capacity limiting the accessibility of the network. Connections fail particularly often in densely populated areas where peaks occur at certain times of the day.

The coverage of mobile telephone networks varies geographically. In some areas one system may have a good coverage while the coverage of another network is poor.

It is in the interest of the mobile telephone service provider to make sure that as many connections as possible are successfully established. For this reason many mobile telephone service providers want mobile telephones that may be used in several telephone networks. These mobile telephone networks may consist of different types of mobile telephone systems, which may imply, for example, that the systems use different carrier frequencies for the radio communication between the mobile telephone and the mobile telephone network. These different types of mobile telephone networks may be provided by one and the same mobile telephone service provider. If it is possible to select the best network at any given time, for example from the mobile telephone, the network may be made more accessible to the users, so that more connections will be established. Mobile telephones that may be used in several networks for different mobile telephony systems require a transmitter and a receiver for each of the mobile telephony systems. In order to keep the mobile telephone at a reasonable size, this means that to the greatest extent possible the same components must be used for the different systems. This reduces the number of components needed in the mobile telephone, making it less expensive, smaller and lighter.

In the European patent application EP 678 974 A2 a transmitter and a receiver for radio frequency systems is disclosed. These radio frequency systems are GSM and PCN. The transmitter and the receiver are intended for use for transmission and reception for two different frequency ranges. One of the common units for the transmitter and the receiver is a voltage controlled crystal oscillator generating a mixer signal LO3 having a frequency of 26 MHz. Further, two synthesizers are connected to the voltage controlled crystal oscillator. Each one of these synthesizers generates a mixer signal, LO1 and LO2, respectively, using the mixer signal LO3 received from the crystal oscillator. The first synthesizer generates the mixer signal LO1 with different frequencies depending on the frequency range to be transmitted and received. For GSM the frequency of LO1 is 1500 MHz and for PCN it is 1200 MHz. The receiver has a common RF base band link for both frequency ranges. Thus, the same amplifier, filter, mixer and I/Q demodulator are used for both frequency ranges. The receiver mixes the mixer signal LO1 with the received RF signal to obtain a first intermediate frequency IF1. The first intermediate frequency IF1 is the same for the two frequency ranges. By varying the mixer signal LO1 between the two above mentioned frequencies depending of the frequency range received, an intermediate frequency IF1 is obtained that is equal for the two frequency ranges. In order to minimize disturbances, this first intermediate frequency IF1 should be 280.4 MHz. The first intermediate frequency IF1 is mixed in the next step with the mixer signal LO2, and a second intermediate frequency IF2 is obtained. This intermediate frequency IF2 is demodulated in an I/Q demodulator, to obtain an I and a Q baseband signal.

A disadvantage of this solution is that the radio frequency is mixed twice before the I/Q demodulation, which increases the power consumption. Keeping the power consumption down is of the utmost importance, for example, in a mobile telephone.

Another disadvantage of this solution is that in order to receive two different radio frequency systems with the receiver, they must have the same channel bandwidth. The receiver does not work for radio frequency systems having different channel bandwidths.

The European patent application EP 682458 A2 discloses a radio communication apparatus intended for transmission and reception in two different digital cellular systems. The apparatus comprises a main unit, enabling communication in one of the cellular systems (GSM) and an additional unit which, together with the main unit, enables communication in the other digital cellular system (PCN). The main unit comprises variable filters, two mixers, a variable synthesizer and a power amplifier intended for GSM. The additional unit, a power amplifier for PCN, may be connected to the main unit.

The filter parameters and the frequency of the output signal from the synthesizer are adjustable. When the additional unit is connected to the main unit, this is detected by a detector connected to a CPU. The CPU orders a control unit to adjust the filter parameters and the frequency of the output signal from the synthesizer to PCN. The switch is then affected by the control unit so that the power amplifier for PCN is connected. When the additional unit is removed, the power amplifier for GSM is connected and the filter parameters and the synthesizer frequency are again adapted to GSM.

One disadvantage associated with this solution is that the additional unit must be brought along to make it possible to connect the mobile telephone to both the systems.

Another disadvantage is that when a signal is received, a mixing is performed to a first intermediate frequency. This mixing implies an unnecessary power loss for the power supply.

Yet another disadvantage of this receiver is that also this receiver requires that the two digital cellular systems to be received must have the same channel bandwidth.

SUMMARY OF THE INVENTION

The present invention attacks the problem of making it possible to receive radio frequency signals in several different frequency bands in the same receiver. The received signals may have different channel bandwidths in the respective frequency band.

Another problem that the invention attacks is to enable the use of the same baseband receiver part when receiving radio frequency signals. This enables a reduction of the number of components in the receiver, which in turn reduces the cost of the receiver.

Yet another problem that the invention attacks is to enable the reception of radio signals from radio communication systems having different requirements on the receiver performance. The reception is to be made in one and the same receiver.

It is a purpose of the present invention to enable the reception of different signals in the RF range from different radio communication systems using a receiver designed in as simple a way as possible.

The multiple band receiver according to the invention constitutes a link in a receiving chain for RF signals from different radio communication systems. The multiple band receiver in turn is arranged with at least two different sublinks, each ending with an I/Q demodulator. The outputs from the I/Q demodulators are connected to a common output which may be connected to a common baseband unit.

The signal processing of the received baseband signals may differ for the different systems. This does not usually constitute a problem as the processing is carried out by units that do not require much power or much space.

The first sublink in the multiple band receiver receives a signal in the RF area having a certain low channel spacing. The received signal is amplified, filtered and then mixed with a certain frequency to obtain a signal in the IF area. The IF signal is I/Q demodulated, to obtain an output signal in a low frequency area. The low frequency area corresponds to the baseband frequency area of that radio communication system for which an RF signal is received.

The other sublink in the multiple band receiver receives a signal in the RF area, which is I/Q demodulated with a higher channel spacing than the first one mentioned. Thereby is obtained an output signal in a different baseband frequency area, which baseband is used in the radio communication system from which the RF signal is received. In the other sublink a direct mixing is carried out from the RF area to the baseband frequency area, whereas in the first mentioned sublink the mixing from the RF area to the baseband frequency area is carried out via an intermediate frequency range.

An advantage with the present invention is that the same baseband device in the receiver may be used for different radio communication systems which are using different RF areas.

Another advantage is that the receiver comprises comparatively few components, which means that a simple, inexpensive design is achieved.

Yet another advantage of the invention is the following. Two different methods are used when mixing from the RF area to the baseband frequency area in the inventive multiple band receiver. This enables the reception of radio communication systems having different requirements on the receiver performance.

The invention will be described in more detail in the following, by means of preferred embodiments and with reference to the enclosed drawings.

DETAILED DESCRIPTION OF EMBODIMENTS

Figure 1:
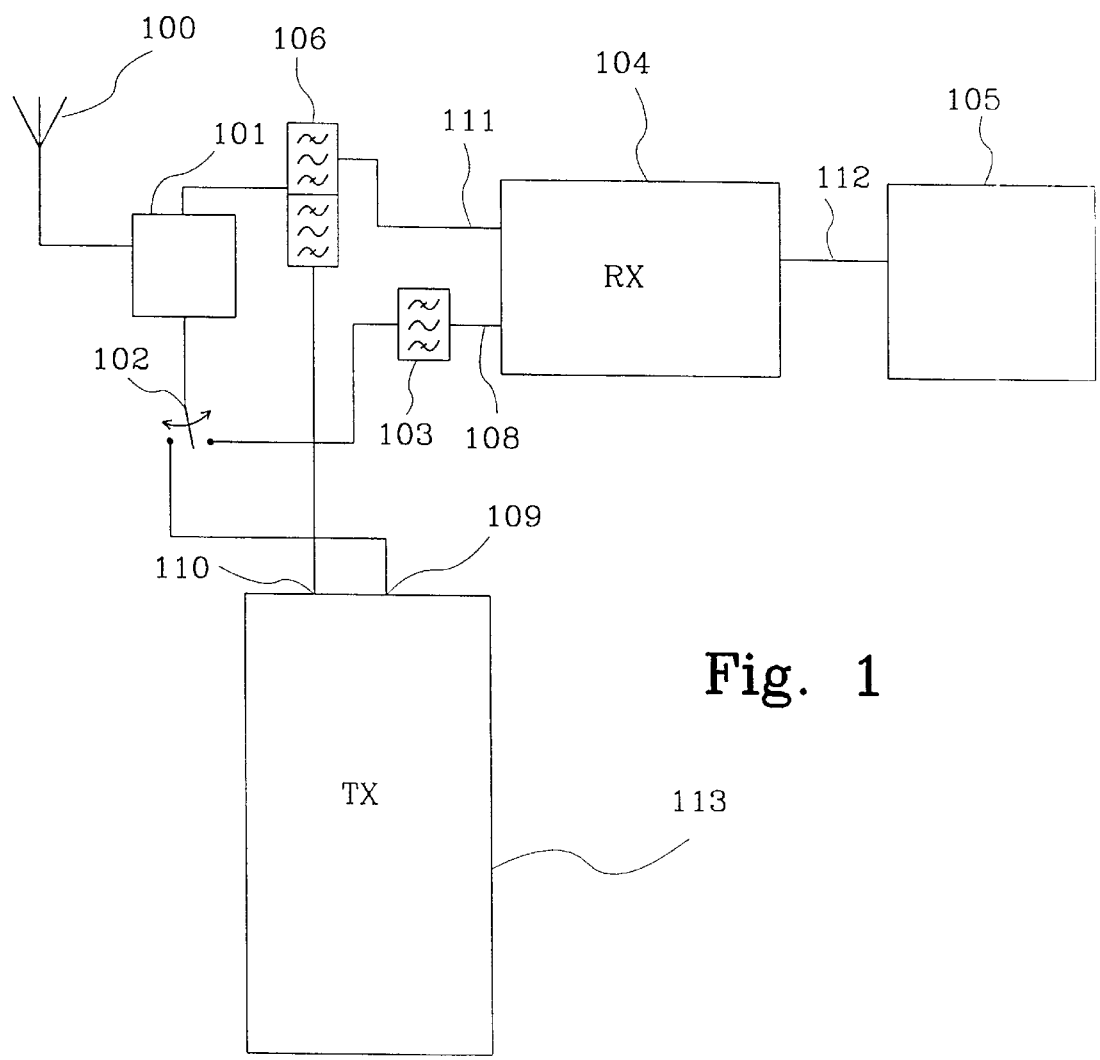
FIG. 1 is a simplified block diagram of a transceiver apparatus.

FIG. 1 is a schematic diagram of a transceiver apparatus in, for example, a mobile telephone for radio communication. The transceiver comprises an antenna 100, an antenna combination unit 101 and a switch 102. The switch connects both a multiple band receiver 104 via a bandpass filter 103 and a transmitter 113 to the antenna combination unit 101. The transceiver apparatus further comprises a duplex filter 106 connecting the transmitter 113 and the multiple band receiver 104 to the antenna combination unit 101. The receiver 104 is arranged to receive signals in several different frequency bands for different types of mobile telephone systems in the radio frequency (RF) area. The different types of mobile telephony systems can also have different channel spacing. The mobile telephony systems may be, for example, AMPS in the frequency band 869–894 MHz with 30 kHz channel spacing, and PCS in the frequency band 1930–1990 MHz with 200 kHz channel spacing.

Other mobile telephone systems in other frequency bands using other channel spacings may, of course, be received if the receiver comprises units adapted to these systems. When the receiver chain is adapted to, for example AMPS and PCS1900, respectively, a selection may be made between receiving signals for these two systems. The selection may be made manually or automatically. For example, the system having the best signal to noise ratio at a given moment may be connected.

Since the frequency bands for signals received in the two systems are different, the antenna 100 must be adapted to the frequency bands of these systems. This is performed by the antenna combination unit 101, which is connected to the antenna 100. The antenna combination unit 101 also functions as a switch. The received RF signal is routed either through the switch 102 and the bandpass filter 103 to a first input 108 or through the duplex filter 106 to a second input 111 on the inventive multiple band receiver 104, the inputs being intended for the RF signal.

As an example it is assumed that the apparatus shown in FIG. 1 is currently adjusted to be used in the system PCS1900. The antenna 100 is then adapted by means of the antenna combination unit 101 for transmission and reception in the frequency band around 1900 MHz. The antenna combination unit 101 is connected to the first bandpass filter 103 by the switch 102, being in one of the positions shown in FIG. 1. This filter is blocking all frequencies outside of the range defined for PCS1900. The inventive multiple band receiver 104 receives, on its input 108, signals in the 1900 MHz-area defined for PCS1900, and with a channel spacing of 200 kHz. At the output 112 of the multiple band receiver 104 signals are received in the baseband frequency range defined for PCS1900. The frequency content of the baseband frequency area ranges from zero Hz up to half the channel spacing for the radio communication system for which the RF signal is received. Since the channel spacing for PCS1900 is 200 kHz, this means that the frequency content of the signal at the output 112 of the mulfiband receiver is 0–100 kHz. The output signal at the outputs 112 is a signal having two baseband channels in quadrature, that is, two signals having the same information content but with a 90° phase difference. This concept is familiar to the person skilled in the art. In the baseband unit, among other things, lowpass filtering, detection and neighbouring channel suppression of the received signal, mixed down to the baseband frequency range, is then carried out.

When the switch 102 is in its other position according to FIG. 1, it connects in a way common in the art, an input 109 of the transmitter 113 to the antenna combination unit 101. Thus the same antenna 100 is used for transmission and reception.

In the case of transmission and reception for another system, for example AMPS, the duplex filter 106 has the same function as the switch 102. This function is to separate the transmit and receive signals. The duplex filter 106 is connected to an output 110 of the transmitter 113 and to the input 111 of the receiver 104, in a way common in the art. At the input 111, the inventive multiple band receiver receives RF signals for AMPS having a channel spacing of 30 kHz. Since AMPS has a channel spacing of 30 kHz, the signal obtained at the output 112 comprises frequencies in the baseband frequency range 0–15 kHz.

The inventive multiple band receiver 104 comprises at least the two inputs 108 and 111, receiving signals in the RF range, and at least the output 112, which is connected to the baseband unit 105. The multiple band receiver 104 further comprises units enabling the connection of one and the same output 112 to one and the same input on the baseband unit 105. This is described in more detail in connection with FIG. 2.

The receiver does not necessarily have to be used together with a transmitter, but can constitute a separate unit in, for example, a paging system, that can receive RF signals in two frequency bands.

The multiple band receiver 104 may be implemented, for example, in an Application Specific Integrated Circuit (ASIC), making the size of the multiple band receiver 104 small. Such an implementation of the inventive multiple band receiver 104 in combination with the use of only one baseband unit 105, enables a smaller receiver with fewer components. Thereby the receiver will be cheaper to manufacture.

Figure 2:
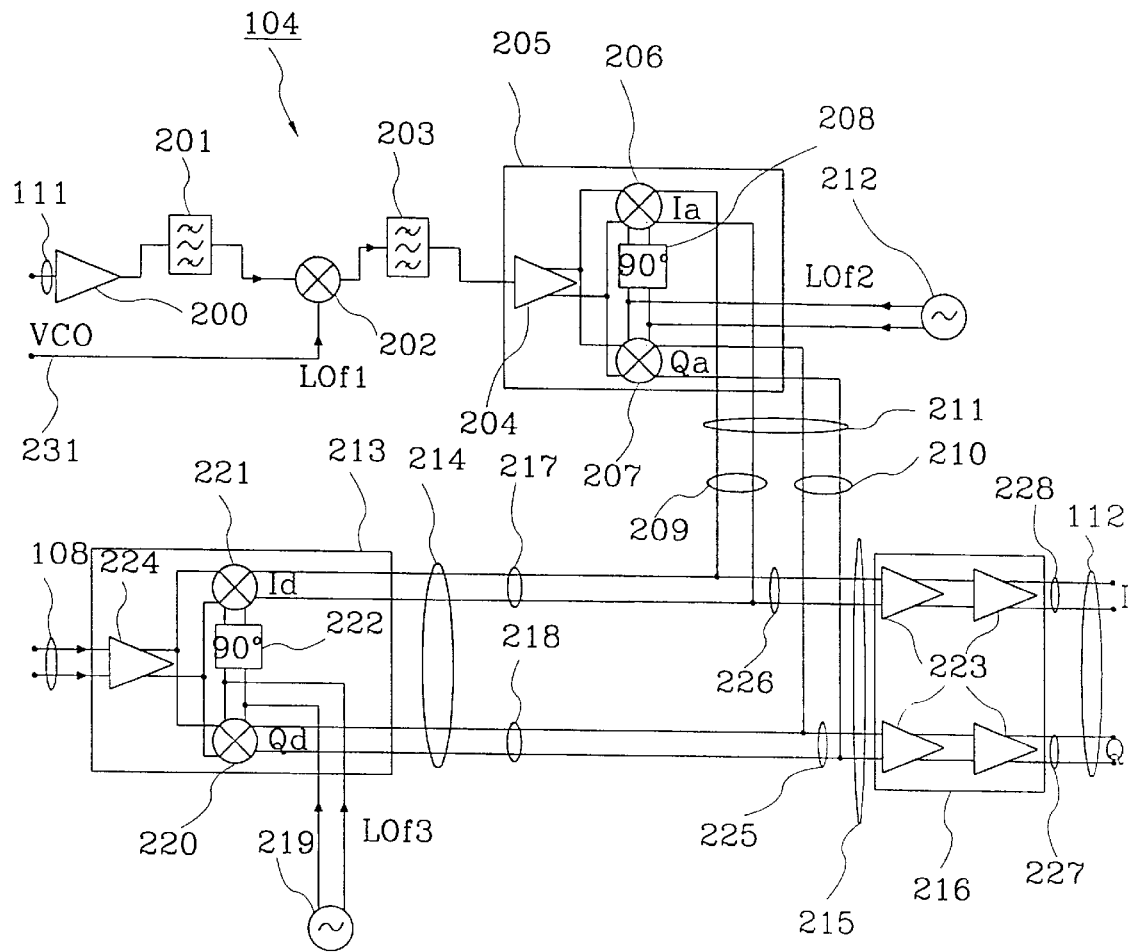
FIG. 2 is a scheme over an embodiment of a multiple band receiver according to the invention.

FIG. 2 shows an embodiment of a multiple band receiver 104 according to the present invention.

A first mobile telephone system (AMPS, NMT) has a certain low channel spacing. Signals with this channel spacing are received at the input 111 and a first mixing of the signals, from the radio frequency range to an intermediate frequency range, is performed by means of a mixer 202. The intermediate frequency signal is then I/Q demodulated in an I/Q demodulator 205, to obtain an output signal in the baseband frequency range at an output 211.

A second mobile telephone system (GSM, PCS1900, DCS1800) has a certain greater channel spacing than the above mentioned first mobile telephone system. Signals with this greater channel spacing are received at the input 108 and the I/Q demodulation is carried out in the I/Q demodulator 213 directly on the received signal in the RF range. An output signal in the baseband frequency range of the input signal of the other system is obtained at an output 214. The outputs 211, 214 are connected to a common output 215 which is connected to an amplifier 216. Signals obtained at the outputs 211, 214 are thus amplified in the amplifier 216 and the result of the amplified signal is obtained at the output 112 (FIG. 1). This output comprises an output pair 227, 228 shown in FIG. 2.

The input 111 is the input to a first amplifier 200 in the multiple band receiver 104. The amplifier 200 is amplifying signals primarily in the radio frequency range. The amplifier 200 may be connected to a bandpass filter 201 which only allows signals in the current radio frequency range to pass. For example, for AMPS, the filter 201 is a bandpass filter having a passband of 869–894 MHz, that is, a bandwidth of 25 MHz.

The filter 201 is also connected to the mixer 202. The mixer 202 receives both the filtered RF signal obtained in the filter 201 and a signal having a previously determined frequency LOf1 from a voltage control oscillator VCO. A signal in the intermediate frequency range is generated. This intermediate frequency range for AMPS and NMT is approximately 78 MHz. The corresponding passband for the filter 201 for NMT is 935–960 MHz.

For AMPS, as an example, frequencies LOf1 are generated by said voltage control oscillator in a frequency range 947–972 MHz and for NMT in the frequency range 1013–1038 MHz.

The mixer 202 is in turn connected to a third bandpass filter 203. This filter 203 eliminates all frequencies of the signal in the intermediate frequency range not comprising any information for the receiver, for example strong disturbing signals on other channels. For AMPS, as an example, the filter 203 is designed to have a centre frequency of 78 MHz and a bandwidth of ±15 kHz, and for NMT the corresponding centre frequency is 78 MHz with a bandwidth of 12.5 kHz.

The filter 203 is connected to the I/Q demodulator 205. The I/Q demodulator comprises a differential amplifier 204, two mixers 206, 207 and a phase shifting device 208. The differential amplifier 204 differentiates the intermediate frequency signal obtained from the filter 203. Through the differentiation signals having a better signal to noise ratio are obtained. An oscillator 212, generating a signal with the frequency LOf2, is connected to the phase shifting device 208 and to the mixer 207. As an example, the frequency LOf2 for AMPS and NMT is 78 MHz.

The phase shifting device 208, which may be for example a passive network, phase shifts the signal generated by the oscillator 212. The phase shifted signal is mixed with the signal differentiated by the differential amplifier, and a signal Ia in the baseband frequency range is generated at an output 209 of the I/Q demodulator 205. The signal generated by the oscillator 212 is mixed with the differentiated signal from the differential amplifier, to obtain another signal Qa in the baseband frequency range at the output 210. The signals Ia and Qa are two baseband channels in quadrature and comprise frequencies from zero up to half the channel spacing for the system for which an RF signal has been mixed from the RF area to the baseband frequency area. The I/Q demodulation described above is well known to the person skilled in the art.

Each of the outputs 209, 210 is connected to an input 226, 225 of the amplifier 216. The signal Ia is amplified by means of at least one amplifier 223, which may be, for example, an operational amplifier. This amplifier is connected as a voltage follower to obtain an output signal I at an output 228. In the same way, through amplification of the signal Qa, an output signal Q is obtained at an output 227. The outputs 227 and 228 are denominated as the output 112 in FIG. 1.

In the other sublink for reception of the signals belonging to the other system, the input 108 is an input to an amplifier 224 amplifying RF signals. The amplifier 224 is a component in the second I/Q demodulator 213 also comprising two mixers 220, 221 and a phase shifter 222. An oscillator 219, generating a signal having the frequency LOf3, is connected to the I/Q demodulator 213. For PCS1900, as an example, the oscillator generates frequencies in a frequency range of 1930–1990 MHz and for DCS1800 the corresponding frequency range is 1805–1880 MHz.

The I/Q demodulator 213 mixes a received signal at the input 108 with the signal having the frequency LOf3 in the same way as described above for the I/Q demodulator. At the output 217, thus, a baseband signal Id is obtained and at an output 218 a baseband signal Qd is obtained. Id and Qd are two baseband channels in quadrature. The signals Id, Qd have a larger baseband frequency range than the signals Ia, Qa. In this case the signals do not need to be mixed down from RF to IF and filters corresponding to the additional filters 201, 203 in the first sublink are not needed. For PCS1900, as an example, this means mixing from the RF range 1900 MHz to the baseband frequency range 0–100 Hz.

The amplifiers used in the invention may be, for example, operational amplifiers having a predetermined amplification or may be connected as voltage followers.

If the inventive multiple band receiver 104 is implemented as an ASIC several units belonging to, for example, the transmitter may be implemented on the ASIC. In this way even more space can be saved, making the RF device even smaller.

The invention is of course not limited to only two sublinks but may be implemented with more than two sublinks in an inventive way.

What is claimed is:

1. A receiver device for radio frequency signals (RF signals) in at least a first and a second frequency band, said RF signals in said first frequency band constituting communication signals for a certain first radio system having low channel spacing and said RF signals in said second frequency band constituting communication signals for a certain second radio system having a high channel spacing, said receiver device comprising:

a receiver having at least a first and a second sublink corresponding to said first and second frequency band respectively;

an adaptation unit for routing incoming RF signals in said first or second frequency band to said first or second sublink of said receiver depending upon which system said incoming signals belong to;

said first sublink of said receiver comprising:
      mixing means for transforming said RF signals into corresponding intermediate frequency signals (IF signals);
      at least a first and a second filter means the bandwidth of which corresponds to said first frequency band; and
      a first demodulation means for demodulation of said IF signals, having a first output pair of quadrature components of the demodulated IF signals in a first baseband;

said second sublink comprising a second demodulation means for demodulation of said RF signals, having a second output pair of quadrature components of said demodulated RF signals in a second baseband; and a connection device for connecting said first and second output pair to a common receiver output.

2. The receiver device according to claim 1, wherein said mixing means mixes received RF signals with a first mixer signal generated by a first oscillator arranged to generate mixer signals intended for RF signals in said first radio system.

3. The receiver device according to claim 2, wherein said IF signals have a carrier frequency of substantially 78 MHZ.

4. The receiver device according to claim 2, wherein said oscillator generates mixer signals (LOf1) in a frequency range substantially equal to 947–972 MHZ, said mixer signals being intended for RF signals in a frequency range substantially equal to 869–894 MHZ.

5. The receiver device according to claim 2, wherein said oscillator generates mixer signals in a frequency range substantially equal to 1013–1038 MHZ, said mixer signals being intended for RF signals in a frequency range substantially equal to 935–960 MHZ.

6. The receiver device according to claim 1, wherein said first filter means is a bandpass filter having a passband substantially equal to said first frequency band and said second filter means is a bandpass filter having a center frequency corresponding to a carrier frequency intended for said IF signals and a bandwidth of substantially plus or minus half the channel spacing of said first radio system.

7. The receiver device according to claim 6, wherein said first filter means is a bandpass filter having a passband substantially equal to 869–894 MHZ and said second filter means is a bandpass filter having a center frequency of substantially 78 MHZ and a bandwidth of substantially ±15 kHz.

8. The receiver device according to claim 6, wherein said first filter means is a bandpass filter having a passband substantially equal to 935–960 MHZ and said second filter means is a bandpass filter having a center frequency of substantially 78 MHZ and a bandwidth of substantially ±12.5 kHz.

9. The receiver device according to claim 1, wherein said first demodulation means carries out said demodulation using a mixer signal having a frequency corresponding to a carrier frequency intended for the IF signals, said mixer signal being generated by an oscillator.

10. The receiver device according to claim 9, wherein said mixer signal has a frequency of substantially 78 MHZ.

11. The receiver device according to claim 10, wherein said first baseband of said quadrature components lies within the frequency range between zero and a value corresponding to half the channel spacing for said first radio system.

12. The receiver device according to claim 11, wherein said baseband of said first radio system lies within a frequency range substantially equal to 0–15 kHz.

13. The receiver device according to claim 1, wherein said second demodulation means uses a mixer signal generated by an oscillator within a frequency range corresponding to said second frequency band.

14. The receiver device according to claim 13, wherein said second baseband of said quadrature components lies within a frequency range from zero up to a value corresponding to half the channel spacing for said second radio system.

15. The receiver device according to claim 14, wherein said second baseband of said second radio system lies within a frequency range substantially equal to 0–100 kHz.

16. The receiver device according to claim 1, wherein said connection device comprises:
   a circuit device comprising at least a first and a second amplifier intended for said respective quadrature components.

17. The receiver device according to claim 1, wherein said adaptation means includes an antenna combination unit.

\* \* \* \* \*